(12) United States Patent
Aoki et al.

(10) Patent No.: US 7,904,045 B2
(45) Date of Patent: Mar. 8, 2011

(54) PHASE DETECTOR COMPRISING A SWITCH CONFIGURED TO SELECT A PHASE OFFSET CLOSEST TO A PHASE OF AN AMPLIFIER

(75) Inventors: Ichiro Aoki, San Clemente, CA (US); Scott D. Kee, Dana Point, CA (US); Dongjiang Qiao, San Diego, CA (US); Alyosha C. Molnar, Berkeley, CA (US)

(73) Assignee: Axiom Microdevices, Inc., Woburn, MA (US)

( * ) Notice: Subject to any disclaimer, the term of this patent is extended or adjusted under 35 U.S.C. 154(b) by 681 days.

(21) Appl. No.: 11/771,267

(22) Filed: Jun. 29, 2007

(65) Prior Publication Data

US 2008/0207138 A1    Aug. 28, 2008

Related U.S. Application Data

(60) Provisional application No. 60/835,739, filed on Aug. 4, 2006.

(51) Int. Cl.
*H04B 1/06* (2006.01)

(52) U.S. Cl. .................. 455/260; 455/76; 455/165.1; 455/255; 455/261; 455/265; 455/75; 455/258; 455/318; 455/180.3; 455/147; 375/355; 375/239; 375/371; 375/373; 375/295; 375/316; 375/300; 375/259; 327/291; 327/161; 327/162; 327/156; 360/32; 370/485; 331/11

(58) Field of Classification Search ............ 455/76, 455/260, 165.1, 255, 261, 265, 96, 75, 258, 455/256, 88, 318, 180.3, 147; 375/355, 239, 375/371, 373, 295, 316, 300, 259; 386/40; 331/36, 11; 327/156, 291, 161, 162; 358/310, 358/4–8, 127–138, 13, 141, 339; 360/32–38, 360/32.1–38.1; 370/485
See application file for complete search history.

(56) References Cited

U.S. PATENT DOCUMENTS

| | | | | |
|---|---|---|---|---|
| 4,514,769 A * | 4/1985 | Gallo | ............... | 386/40 |
| 6,509,800 B2 * | 1/2003 | Stockton | ............... | 331/11 |
| 6,741,846 B1 * | 5/2004 | Welland et al. | ............... | 455/260 |
| 6,950,485 B2 * | 9/2005 | Richards et al. | ............... | 375/355 |
| 6,993,307 B2 * | 1/2006 | Welland et al. | ............... | 455/260 |
| 7,035,607 B2 * | 4/2006 | Lim et al. | ............... | 455/147 |
| 7,092,675 B2 * | 8/2006 | Lim et al. | ............... | 455/76 |
| 7,095,992 B2 * | 8/2006 | Kim et al. | ............... | 455/180.3 |
| 7,200,364 B2 * | 4/2007 | Lim et al. | ............... | 455/76 |
| 7,242,912 B2 * | 7/2007 | Maligeorgos et al. | ......... | 455/88 |
| 7,577,224 B2 * | 8/2009 | Eldredge | ............... | 375/373 |
| 7,609,798 B2 * | 10/2009 | Eldredge et al. | ............... | 375/371 |
| 2001/0001616 A1 * | 5/2001 | Rakib et al. | ............... | 375/259 |
| 2001/0024474 A1 * | 9/2001 | Rakib et al. | ............... | 375/259 |

(Continued)

*Primary Examiner* — Matthew D Anderson
*Assistant Examiner* — April G Gonzales

(57) ABSTRACT

A phase detector includes a plurality of phase detectors located in a phase correction loop, each phase detector configured to receive as input a radio frequency (RF) input signal and an RF reference signal, each of the plurality of phase detectors also configured to provide a signal representing a different phase offset based on the phase difference between the RE input signal and the RF reference signal; and a switch configured to receive an output of each of the plurality of phase detectors and configured to select the output representing the phase offset, that is closest to a phase of an output of an amplifier.

22 Claims, 11 Drawing Sheets

U.S. PATENT DOCUMENTS

| | | |
|---|---|---|
| 2001/0046266 A1* | 11/2001 | Rakib et al. .................. 375/259 |
| 2002/0015423 A1* | 2/2002 | Rakib et al. .................. 370/485 |
| 2003/0156603 A1* | 8/2003 | Rakib et al. .................. 370/485 |
| 2004/0077327 A1* | 4/2004 | Lim et al. .................... 455/318 |
| 2008/0031383 A1* | 2/2008 | Magoon et al. ............. 375/300 |
| 2008/0032634 A1* | 2/2008 | Magoon et al. ................ 455/75 |

* cited by examiner

PHASE DETECTOR COMPRISING A SWITCH CONFIGURED TO SELECT A PHASE OFFSET CLOSEST TO A PHASE OF AN AMPLIFIER

CROSS REFERENCE TO RELATED APPLICATION

This application claims priority to co-pending U.S. provisional application entitled, "A Robust, Low Delay, Replica Linearized Power Amplifier Implementation Using Corrective Feedback For Amplitude and Phase Control," having Ser. No. 60/835,739, filed on Aug. 4, 2006, and which is entirely incorporated herein by reference. This application is also related to co-pending, commonly assigned U.S. patent application entitled "System and Method For Low Delay Corrective Feedback Power Amplifier Control" having Ser. No. 11/771,130, filed on even date herewith; and co-pending, commonly assigned U.S. patent application entitled "Replica Linearized Power Amplifier" having Ser. No. 11/771,156, filed on even date herewith.

BACKGROUND

Portable communication devices such as cellular-type telephones or other communication devices are becoming more widespread. A portable communication device includes one or more power amplifiers for amplifying the power of the signal to be transmitted from the portable communication device.

With the decreasing size of portable communication devices, power efficiency is one of the most important design criteria. Reducing power consumption prolongs power source life and extends stand-by and talk time of the portable communication device.

A portable communication device may employ a constant or a non-constant envelope modulation methodology. A non-constant envelope modulation scheme is typically implemented with a linear power amplifier. The entire amplitude and phase modulated waveform is provided to the input of the power amplifier and the power amplifier amplifies the combined signal. In a non-constant envelope modulation scheme, "power control" can be implemented as a "slow loop" regulating the gain of the power amplifier or adjusting the input amplitude to compensate for gain variation in the power amplifier that occurs due to process and temperature variations. Unfortunately, a linear power amplifier is significantly less efficient than a nonlinear power amplifier and, as such, consumes more power.

In the case where both a constant envelope modulation methodology and a non-constant envelope modulation methodology are employed, such as in a communication device that operates using the Global System for Mobile Communication (GSM) and the Enhanced Data Rates for GSM Evolution (EDGE) communication formats, the same power amplifier should be used for both signals. The GSM system provides a slightly higher output power and uses a constant-envelope modulation methodology. The EDGE system uses a non-constant-envelope modulation methodology. If a linear power amplifier is used to implement EDGE, then the power amplifier is less efficient when operated in GSM mode. This is why it is desirable to find a way to make a non-linear power amplifier work in EDGE mode.

Polar modulation is a known technique of performing non-constant envelope modulation using a nonlinear power amplifier. In polar modulation, a phase modulated input signal is applied to the radio frequency (RF) input to the power amplifier. The output power of the power amplifier is adjusted at the rate of the amplitude modulation to recompose the modulated waveform at the output of the power amplifier.

A GSM system has traditionally been implemented using a nonlinear power amplifier, with the "power control" implemented as a (slow) gain modulation in the power amplifier. A "power control" signal is supplied to the power amplifier from the baseband subsystem to implement the time-slotting (ramp up power at the beginning of the time slot, ramp it down at the end) of the communication protocol using this slow gain modulation. One prior attempt at implementing a power amplifier in the EDGE system using polar modulation increases the performance of the "power control" signal, so that the power amplifier output power can be changed rapidly to create the modulation and to create the power control (i.e. there is still the slow ramp up and ramp down at the edges of the slot, but the faster modulation is also added in the middle). In this manner, the power amplifier can still be used in GSM mode by applying a signal to the "power control" port with only the ramping signals, while also performing polar modulation in EDGE mode.

There are two kinds of polar modulation: open-loop and closed-loop. In open loop, there is no feedback path for the power amplifier output. In closed-loop, feedback on the amplitude and phase paths is used to measure the output amplitude and phase. The measured amplitude and phase are compared to a desired signal, and then an amplitude and gain correcting mechanism is used to minimize any discrepancy. Such an implementation is difficult while maintaining a very wide bandwidth, meeting noise requirements and preventing the system from becoming unstable and oscillating under output mismatch, for example, in the presence of a voltage standing wave ratio (VSWR).

In such a system, the phase modulation is typically applied directly to the signal input of the power amplifier. The phase can be controlled using a phase correction feedback loop. One of the challenges when implementing a so called "closed-loop polar modulation" technique is that changes in the phase of the output RE signal relative to the phase of the desired RF signal must be measured with high accuracy so that corrections to the output phase can be made.

To control the phase of the transmit signal, a phase detector in a phase correction feedback loop can be used to determine the phase of the output signal relative to the phase of the input signal, also referred to as a reference signal. The output of the phase detector is used as an error signal to control a phase shifter, which alters the phase of the transmit signal based on the difference between the phase of the output signal and the phase of the input signal. Phase detectors can also be used in applications such as phase locked loops (PLLs), phase demodulation, and in phase correction feedback loops.

FIG. 1 is a schematic diagram of a phase correction feedback loop for correcting amplifier phase distortion. Phase correction feedback loop 100 can be used to correct phase distortion caused by an amplifier 102. The phase correction feedback loop 100 comprises a phase detector 101, a phase shifter 103, a feedback network 104, and a low pass filter 106.

The amplifier 102 receives an input signal on connection 110 to produce an output. One common shortcoming with amplifiers is that they can produce phase distortion between the input signal on connection 110 and the output signal. One possible cause of this distortion can be due to amplitude modulation of the input signal 110 combined with AM/PM distortion in the amplifier 102. Another possible cause is if the amplifier 102 is configured to be a variable gain amplifier, such as if the amplifier 102 is used in polar modulation, where the phase relationship between the input signal on connection 110 and the output signal varies with the gain of the amplifier 102.

The phase correction feedback loop 100 can be used to reduce this phase distortion. The phase shifter 103 is placed between the RE input on connection 112 and the input of the amplifier 102 on connection 110. The output of the amplifier 102 is coupled through the feedback network 104 to an input of the phase detector 101. An RF reference signal is provided on connection 107 to the phase detector 101. In this example, the RF reference signal is the RF input signal. The phase detector 101 can be used to produce a detected signal on connection 109 related to the phase difference between the output of the amplifier 102 and the RF reference signal on connection 107. The detected signal on connection 109 can be filtered by the low pass filter 106 and provided as a control voltage to the phase shifter 103. The phase correction feedback loop 100 can control the phase shift between the input to the phase correction feedback loop 100 on connection 112 and the input to the amplifier 102 on connection 110 to keep the phase of the RF reference signal on connection 107 and the input to the phase detector 101 on connection 108 nearly constant. Since the phase of input signal to the phase detector 101 on connection 108 and the phase of the output of the amplifier 102 can be the same, or have a constant offset between them, the phase correction feedback loop 100 can be used to keep a constant phase relationship between the input to the phase correction loop on connection 112 and the output of the amplifier 102.

FIG. 2 is a schematic diagram of a prior art phase detector that can be used in the phase correction feedback loop of FIG. 1. The phase detector 200 comprises exclusive or gate 201, dc offset cancellation circuit 202, and an averaging filter 203. The exclusive or gate 201 receives the RF input signal and the RF reference signal as inputs and provides as an output the logical exclusive or of the two input signals. The output signal can be time-varying, and can have an average value related to the difference in phase between the input signal and the reference signal. This average value can have a value between zero and the supply voltage, Vdd, of the amplifier, such that when the input and reference signals have a phase relationship of 90 degrees between them, the output of the exclusive or gate 201 can be nearly Vdd/2. The dc offset cancellation circuit 202 can be used to remove any dc offset associated with the supply voltage, Vdd/2, so that the output of the dc offset cancellation circuit 202 can be zero when the phases of the input signals have a phase relationship of 90 degrees between them. The averaging filter 203 can remove the RF content of the detected signal while transmitting the average value of the detected signal to the output. Other phase detectors are known in the art, such as using other types of logic gates, using digital systems including flip-flops, and using mixers.

FIG. 3 is a graphical diagram illustrating the relationship between the phase of the RF input signal and the phase of the RF output signal of the phase detector 200 of FIG. 2. The waveform 301 shows the output of the phase detector 200 versus the difference between the phases of the RF input signal and the RF reference signal. As the phase of the RE input signal changes with respect to the phase of the RF reference, the output of the phase detector 200 can change, giving an indication of this phase difference. When used as the phase detector 101 in the phase correction feedback loop 100, the phase correction feedback loop 100 can reach a stable closed loop condition when the output 301 of the phase detector 200 has value of zero and negative slope. After settling, the phase correction feedback loop 100 can reach this stable point 302 and maintain the phase correction feedback loop 100 at that phase difference between input and reference phases.

FIG. 4 is a graphical diagram illustrating the output phase of the amplifier 102 as the phase correction feedback loop 100 is enabled. The waveform 401 represents the output phase of the amplifier 102 versus time. At time 403, the phase correction feedback loop 100 is enabled, causing the loop to begin to correct the phase to the stable point of the system indicated by the dashed line 402. As a result, the phase correction feedback loop 100 can require the phase shifter 103 to change its response over a phase range 404, which is the difference between the open-loop phase before the phase correction loop is enabled and the stable point 402.

The phase change indicated by the phase range 404 can be detrimental to the system if the amount of the change 404 is high. Since this change is produced by the phase shifter 103, the phase shifter 103 may be required to produce a wide range of phase shift. For example, if the open-loop output phase is 180 degrees from the stable point, the phase shifter can be required to provide −180 degrees of phase shift for compensation. This requirement for large phase shifts can put excessive burden on the design of the phase shifter, since simple phase shifters may only be capable of shifting the phase less than 90 degrees.

Another potential issue with the potentially large phase change over the phase range 404 can be a degradation in the power amplifier output spectrum during the time when the phase correction feedback loop 100 is settling. The relatively fast phase change that the loop may create can result in spreading of the rf spectrum. The amount of spectral spreading can be related to the amount of the phase change, such that smaller phase changes result in smaller degradation of the output spectrum.

In many applications it can be difficult to constrain the open loop phase to be very close to the stable point, such as if the amplifier can be presented with load mismatch. Therefore, it is desirable to have a phase detector which can enable the operation of a phase correction feedback loop while reducing the amount of the phase change that must be initially compensated when the phase correction feedback loop is first enabled.

SUMMARY

Embodiments of the invention include a phase detector. The phase detector includes a plurality of phase detectors located in a phase correction loop, each phase detector configured to receive as input a radio frequency (RF) input signal and an RF reference signal, each of the plurality of phase detectors also configured to provide a signal representing a different phase offset based on the phase difference between the RF input signal and the RF reference signal and a switch configured to receive an output of each of the plurality of phase detectors and configured to select the output representing the phase offset, that is closest to a phase of an output of an amplifier.

Related embodiments and methods of operation are also provided. Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Although described with particular reference to application in a portable transceiver, the phase detector can be implemented in any device in which it is desirable to be able to determine a phase difference between two signals.

The phase detector can be implemented in hardware, software, or a combination of hardware and software. When implemented in hardware, the phase detector can be implemented using specialized hardware elements and logic. When the phase detector is implemented at least partially in software, the software portion can be used to control components in the phase detector so that various operating aspects can be software-controlled. The software can be stored in a memory and executed by a suitable instruction execution system (microprocessor). The hardware implementation of the phase detector can include any or a combination of the following technologies, which are all well known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for the phase detector comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer-readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

Figure 1:
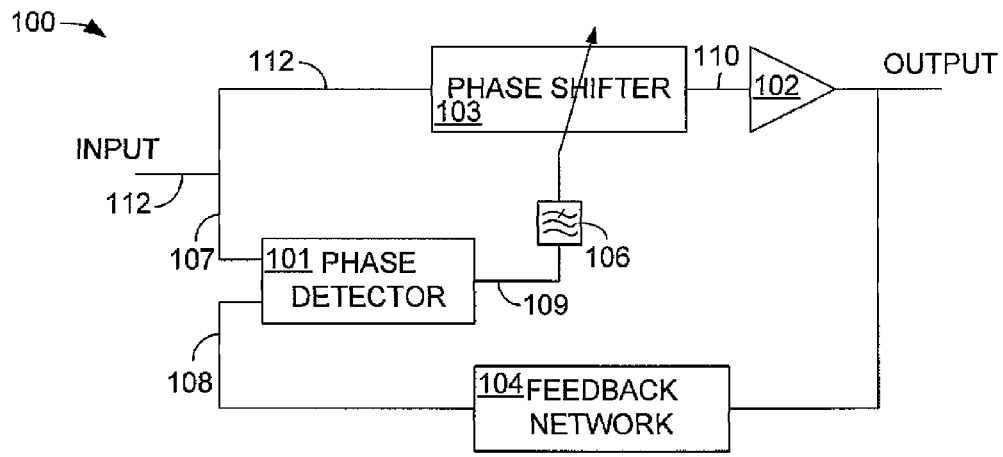
FIG. 1 is a schematic diagram of a phase correction feedback loop for correcting amplifier phase distortion.
Figure 2:
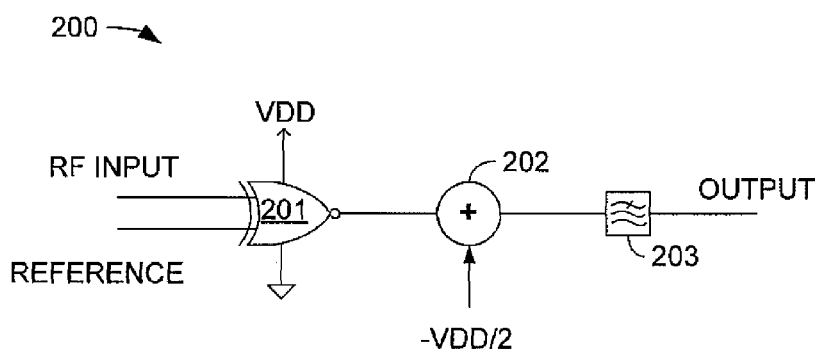
FIG. 2 is a schematic diagram of a prior art phase detector that can be used in the phase correction phase correction feedback loop of FIG. 1.
Figure 3:
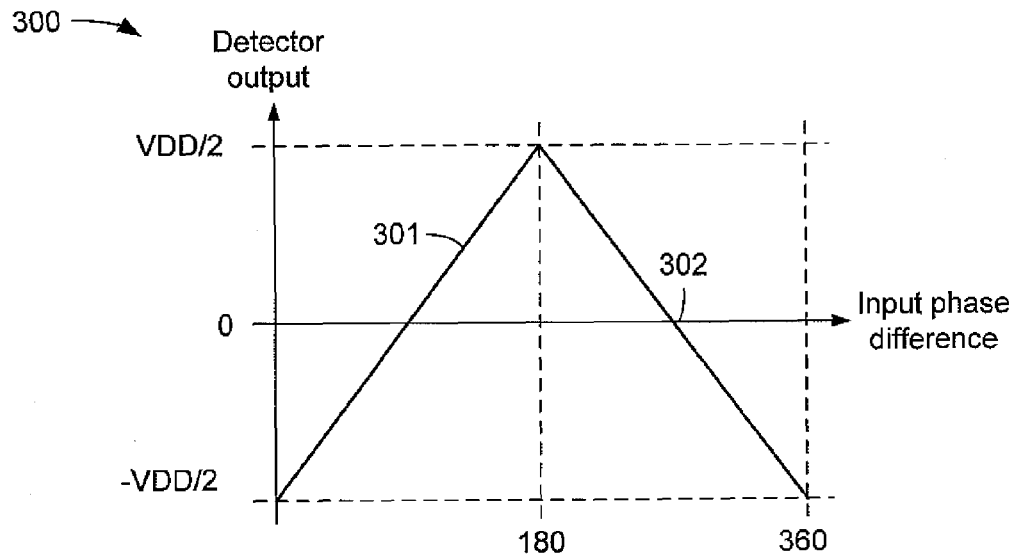
FIG. 3 is a graphical diagram illustrating the relationship between the phase of the RF input signal and the phase of the RF output signal of the phase detector of FIG. 2.
Figure 4:
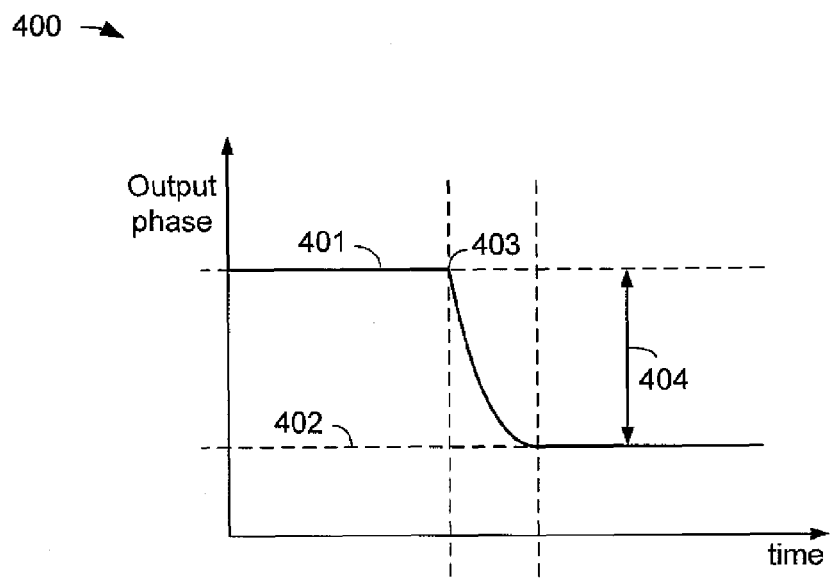
FIG. 4 is a graphical diagram illustrating the output phase of the amplifier as the phase correction feedback loop of FIG. 1 is enabled.
Figure 5:
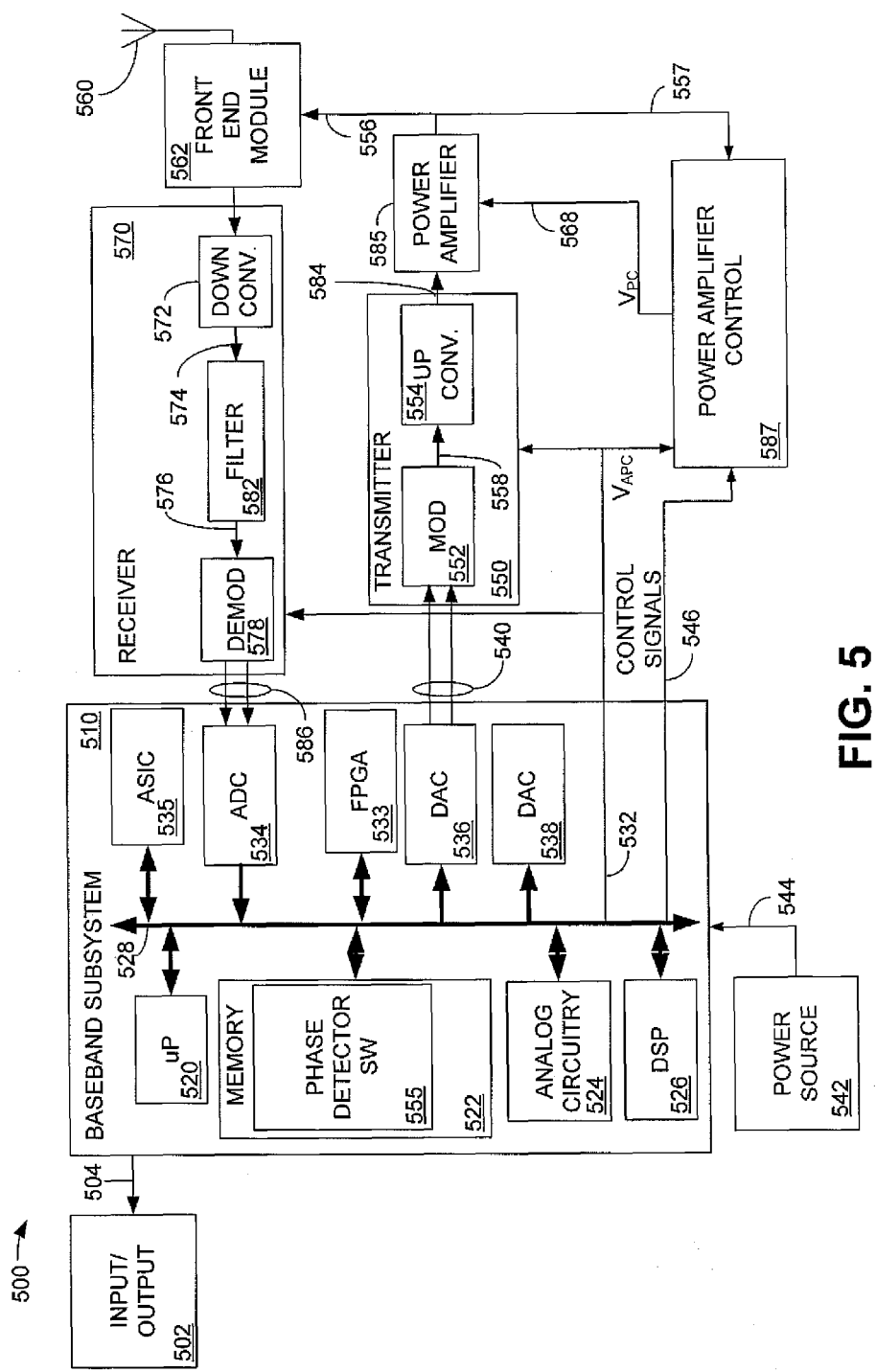
FIG. 5 is a block diagram illustrating a simplified portable transceiver including an embodiment of a phase detector.

FIG. 5 is a block diagram illustrating a simplified portable transceiver 500 including an embodiment of a phase detector. The portable transceiver 500 includes an input/output (I/O) module 502. Depending on the type of portable transceiver, the input/output module 502 may include a speaker, a display, a keyboard, a microphone, a trackball, a touch pad, or any other user interface device. A power source 542, which may be a direct current (DC) battery or other power source, is also connected to the baseband subsystem 510 via connection 544 to provide power to the portable transceiver 500. In a particular embodiment, portable transceiver 500 can be, for example but not limited to, a portable telecommunication device such as a mobile cellular-type telephone. The power source 542 might be connected directly to other parts of the transceiver as well, for example the receiver 570, the transmitter 550, and/or the power amplifier 585.

The baseband subsystem 510 includes a microprocessor (μP) 520, a memory 522, analog circuitry 524, and digital signal processor (DSP) 526 in communication via bus 528. Bus 528, although shown as a single bus, may be implemented using multiple busses connected to provide a physical connection and a logical connection among the subsystems within baseband subsystem 510.

Depending on the manner in which the phase detector is implemented, the baseband subsystem 510 may also include one or more of an application specific integrated circuit (ASIC) 535 and a field programmable gate array (FPGA) 533.

Microprocessor 520 and memory 522 provide the signal timing, processing and storage functions for portable transceiver 500. Analog circuitry 524 provides the analog processing functions for the signals within baseband subsystem 510. Baseband subsystem 510 provides control signals to transmitter 550, receiver 570 power amplifier 585 and the power amplifier control element 587 such as through connection 532 for example.

The baseband subsystem 510 generates a power control signal that includes an amplitude-modulation (AM) component and provides the AM signal on connection 546 to the power amplifier control element 587. In practice, the functions of generating the power control signal and the AM signal can alternatively be integrated within other parts of the transceiver as well, for example in the transmitter 550 or in the power amplifier control element 587. The power control signal can be referred to as $V_{APC}$. The power control signal, $V_{APC}$, can be generated by the baseband subsystem 510 and is converted to an analog control signal by the digital-to-analog converter (DAC) 538. The power control signal, $V_{APC}$, s illustrated as being supplied from the bus 528 to indicate that the signal may be generated in different ways as known to those skilled in the art. The power control signal, $V_{APC}$, is a reference voltage signal that defines the transmit power level and provides the power profile. Generally, the power control signal, $V_{APC}$, controls the power amplifier as a function of the peak voltage of the power amplifier determined during calibration, and corresponds to power amplifier output power. In some embodiments the power control signal might be in the form of a current or a digital signal rather than an analog voltage.

The control signals on connections 532 and 546 may originate from the DSP 526, the ASIC 535, the FPGA 533, or from microprocessor 520, and are supplied to a variety of connections within the transmitter 550, receiver 570, power amplifier 585, and the power amplifier control element 587. It should be noted that, for simplicity, only the basic components of the portable transceiver 500 are illustrated herein. The control signals provided by the baseband subsystem 510 control the various components within the portable transceiver 500. Further, the function of the transmitter 550 and the receiver 570 may be integrated into a transceiver.

If portions of the phase detector are implemented in software that is executed by the microprocessor 520, the memory 522 will also include phase detector software 555. The phase detector software 555 comprises one or more executable code segments that can be stored in the memory and executed in the microprocessor 520. Alternatively, the functionality of the phase detector software 555 can be coded into the ASIC 535 or can be executed by the FPGA 533, or another device. Because the memory 522 can be rewritable and because the FPGA 533 is reprogrammable, updates to the phase detector software 555 can be remotely sent to and saved in the portable transceiver 500 when implemented using either of these methodologies.

Baseband subsystem 510 also includes analog-to-digital converter (ADC) 534 and digital-to-analog converters (DACs) 536 and 538. In this example, the DAC 536 generates the in-phase (I) and quadrature-phase (Q) signals 540 that are applied to the modulator 552. Other embodiments are possible, for example by utilizing direct modulation of a phase locked loop (PLL) synthesizer or direct digital synthesizer (DDS). These methods are well-know to those skilled in the art. In this example, the DAC 538 generates the power control signal, $V_{APC}$, on connection 546. ADC 534, DAC 536 and DAC 538 also communicate with microprocessor 520, memory 522, analog circuitry 524, DSP 526 and FPGA 533 via bus 528. DAC 536 converts the digital communication information within baseband subsystem 510 into an analog signal for transmission to a modulator 552 via connection 540. Connection 540, while shown as two directed arrows, includes the information that is to be transmitted by the transmitter 550 after conversion from the digital domain to the analog domain.

The transmitter 550 includes modulator 552, which modulates the analog or digital information on connection 540 and provides a modulated signal via connection 558 to upconverter 554. The upconverter 554 transforms the modulated signal on connection 558 to an appropriate transmit frequency and provides the up converted signal to a power amplifier 585 via connection 584. In alternative embodiments, the modulator 552 and the upconverter 554 can be combined into a single element that provides both functions simultaneously. The power amplifier 585 amplifies the signal to an appropriate power level for the system in which the portable transceiver 500 is designed to operate.

Details of the modulator 552 and the upconverter 554 have been omitted, as they will be understood by those skilled in the art. For example, the data on connection 540 is generally formatted by the baseband subsystem 510 into in-phase (I) and quadrature (Q) components. The I and Q components may take different forms and be formatted differently depending upon the communication standard being employed. For example, when the power amplifier 585 is used in a constant-amplitude, phase (or frequency) modulation application such as the global system for mobile communications (GSM), the phase modulated information is provided by the modulator 552. When the power amplifier 585 is used in an application requiring both phase and amplitude modulation such as, for example, extended data rates for GSM evolution, referred to as EDGE, the Cartesian in-phase (I) and quadrature (Q) components of the transmit signal are converted to their polar counterparts, amplitude and phase. The phase modulation is performed by the modulator 552, while the amplitude modulation is performed by the power amplifier control element 587, where the amplitude envelope is defined by the PA power control voltage $V_{PC}$, which is generated by the power amplifier control element 587. This technique is known as polar modulation.

The power amplifier 585 supplies the amplified signal via connection 556 to a front end module 562. The front end module 562 comprises an antenna system interface that may include, for example, a diplexer having a filter pair that allows simultaneous passage of both transmit signals and receive signals, as known to those having ordinary skill in the art. The transmit signal is supplied from the front end module 562 to the antenna 560.

A signal received by antenna 560 will be directed from the front end module 562 to the receiver 570. The receiver 570 includes a downconverter 572, a filter 582, and a demodulator 578. If implemented using a direct conversion receiver (DCR), the downconverter 572 converts the received signal from an RF level to a signal centered around baseband frequency (DC), or a near-baseband frequency (~100 kHz). Alternatively, the received RF signal may be downconverted to an intermediate frequency (IF) signal, depending on the application. The downconverted signal is sent to the filter 582 via connection 574. The filter comprises a least one filter stage to filter the received downconverted signal as known in the art.

The filtered signal is sent from the filter 582 via connection 576 to the demodulator 578. The demodulator 578 recovers the transmitted analog information and supplies a signal representing this information via connection 586 to ADC 534. ADC 534 converts these analog signals to a digital signal at baseband frequency and transfers the signal via bus 528 to DSP 526 for further processing.

Figure 6:
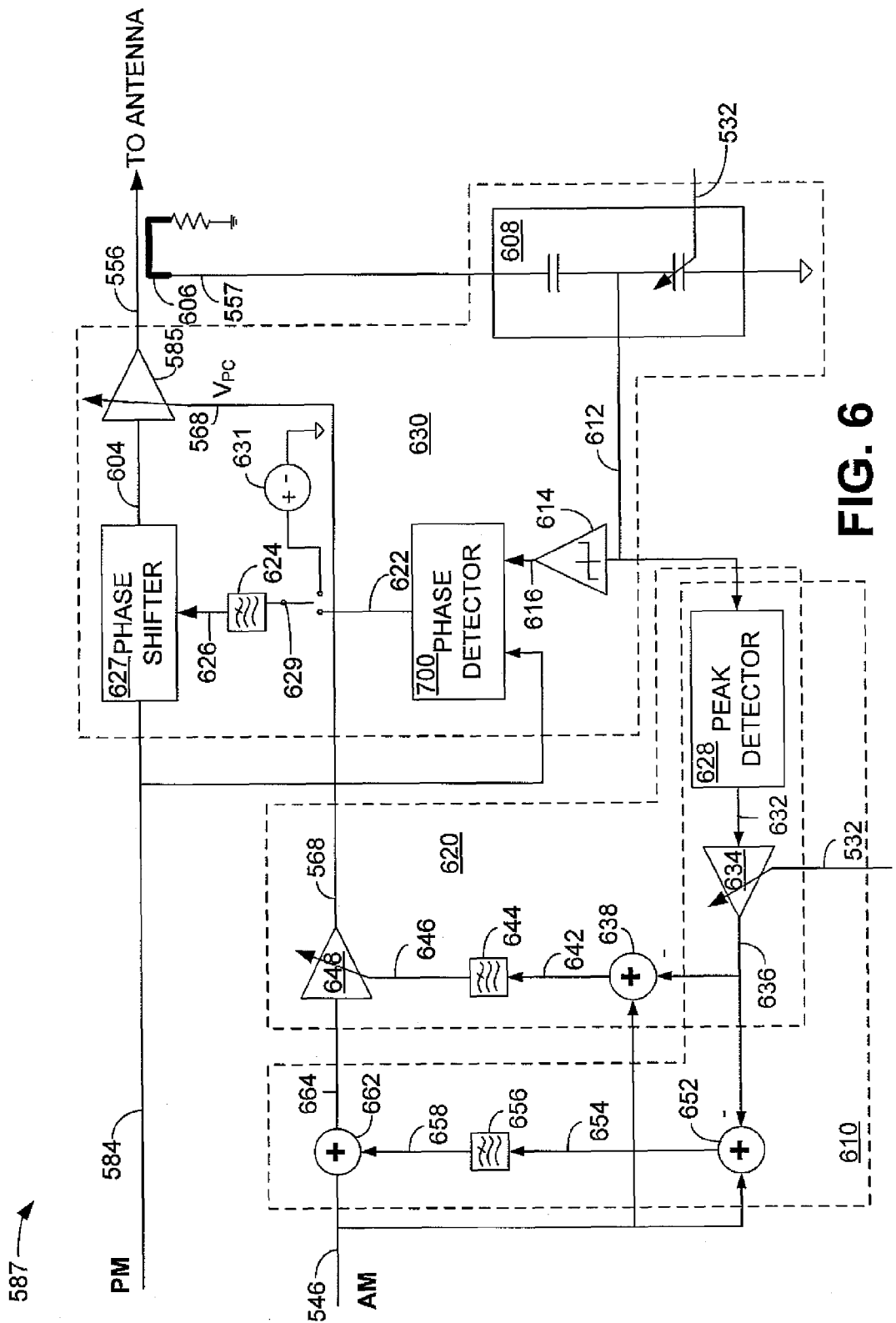
FIG. 6 is a block diagram illustrating an embodiment of the power amplifier control element of FIG. 5 including an embodiment of a phase detector.

FIG. 6 is a block diagram illustrating an embodiment of the power amplifier control element 587 of FIG. 5. The power amplifier control element 587 controls the power output of the power amplifier 585, which receives a phase modulated (PM) signal via connection 584 and an amplitude modulation (AM) control signal via connection 546. In this embodiment, the AM and PM are independently controlled and are combined in the power amplifier circuitry. The AM signal on connection 546 is provided via the baseband subsystem 510 (FIG. 5) and is used as a control signal which impresses the AM on the control port of the power amplifier 585. The AM signal is used to control the power output of the power amplifier 585. The PM signal on connection 584 is a signal comprising a low-frequency phase modulation of the radio frequency RF carrier supplied to the RF input of the power amplifier 585.

However, applying the amplitude modulation to the control port of the power amplifier 585 can distort the phase portion of the signal through the power amplifier 585, such as if the phase delay of the power amplifier 585 changes with the control signal or the output level. Additionally, the output amplitude can be distorted relative to the desired output amplitude if the output amplitude of the power amplifier 585 does not accurately track the control signal 568. To minimize these phase and amplitude distortions, the power amplifier control element 587 comprises a phase correction loop (phase loop) 630 in addition to an outer AM correction loop (outer Am loop) 610 and an inner AM correction loop (inner AM loop) 620. The inner and outer AM correction loops improve the linearity of the AM control of the power amplifier 585. The bandwidth of the outer AM correction loop 610 is larger than the bandwidth of the inner AM correction loop 620 by an approximate magnitude of 10. In an example using the EDGE modulation spectrum, the bandwidth of the outer AM correction loop 610 is approximately 2 megahertz (MHz) and the bandwidth of the inner AM correction loop 620 is approximately 200 kilohertz (kHz). The bandwidth of the phase correction loop 630 is approximately 2 MHz. The approximate decade difference between the outer AM correction loop 610 and the inner AM correction loop 620 helps to maintain the stability of the power amplifier control element 587.

In an embodiment, the power amplifier 585 is implemented using a power amplifier device having a linearized control circuit and methodology, which linearizes the amplitude control characteristic of the power amplifier 585. This power amplifier is also referred to as a "replica-corrected power amplifier."

In an embodiment, the power amplifier 585, the outer AM correction loop 610, the inner AM correction loop 620 and the phase correction loop 630 are implemented on the same semiconductor die. In this manner, the response of the components is similar with respect to process and temperature variations.

A portion of the output of the power amplifier 585 on connection 556 is coupled by using, for example, an RF coupler 606 to connection 557. Alternately, other couplings can be used, such as a direct connection, capacitive division, voltage sense, current sense, or other couplings or combinations of couplings. The RF signal on connection 557 is provided to a variable attenuator 608. The variable attenuator 608 is controlled by a signal from the baseband subsystem 510 via connection 532. The control signal on connection 532 controls the amount of attenuation provided by the variable attenuator 608. The output of the variable attenuator 608 is provided via connection 612.

The outer AM correction loop 610 comprises a peak detector 628, a baseband variable gain amplifier (VGA) 634, an adder 652, a low pass filter 656 and an adder 662. The output of the variable attenuator on connection 612 is coupled to the peak detector 628. The peak detector 628 removes the RF portion of the signal from connection 612 and provides via connection 632 to the baseband VGA 634 a baseband signal that is proportional to the AM envelope of the RF signal on connection 612. The baseband VGA 634 is controlled by a signal via connection 532 from the baseband subsystem 510. The baseband VGA 634 adjusts the gain of the signal at connection 632 and provides an output via connection 636. The output of the baseband VGA 634 on connection 636 is provided to an adder 652. Another input to the adder 652 is the AM control signal on connection 546. The signal on connection 636 is subtracted from the AM control signal on connection 546 and the output of the adder 652 is provided via connection to 654 to the low pass filter 656. The low pass filter 656 may be a passive device or an active device having a frequency response and a gain value. The output of the low pass filter 656 on connection 658 is combined with the AM control signal on connection 546 in the adder 662. The output of the adder 662 is provided via connection 664 to the inner AM control loop 620.

The outer AM correction loop 610 operates at a wide bandwidth (in this example approximately 2 MHz) compared to the inner AM correction loop 620 and can correct offsets, and distortion that can exist in the forward path through the power amplifier 585. The outer AM correction loop 610 also linearizes the control loop and corrects any AM control nonlinearity present in the power amplifier 585.

The inner AM correction loop 620 includes the peak detector 628, baseband VGA 634, an adder 638, a low pass filter 644 and a VGA 648. While the baseband VGA 648 is shown as an amplifier, the baseband VGA can be any variable gain element. The output of the baseband VGA 634 on connection 636 is also provided to an adder 638. Another input to the adder 638 is the AM control signal on connection 546. The signal on connection 636 is subtracted from the signal on connection 546 and provided as an output of the adder 638 on connection 642. The signal on connection 642 is provided to the low pass filter 644, the output of which on connection 646 is used to control the gain of the VGA 648. The low pass filter 644 may be a passive device or an active device having a frequency response and a gain value. The input to the VGA 648 is taken from the output of the adder 662. This signal on connection 664 represents the AM signal on connection 546 as corrected by the outer AM correction loop 610. The output of the VGA 648 on connection 568 is the control signal that is applied to the control port of the power amplifier 585 and includes the AM portion of the transmit signal. In this manner, the AM control signal on connection 546 is used to control the output power of the power amplifier 585 and is also used to impress the AM portion of the transmit signal.

The inner AM correction loop 620 employs multiplicative corrective feedback to allow the VGA 648 to compensate for gain changes in the forward path. The gain changes in the forward path may occur due to, for example, changing VSWR, etc. The outer AM correction loop 610 employs linear corrective feedback to correct offset and non-linearity in the forward path. The inner AM correction loop 620 maintains a constant bandwidth in the outer AM correction loop 610 by forcing the outer AM correction loop 610 to have a constant gain. Therefore, any impedance change at the output of the power amplifier 585, or any electrical change that affects the gain in the forward path, is canceled by the VGA 648. This forces the gain and bandwidth of the outer AM correction loop 610 to be constant. In this example, the bandwidth of the inner AM correction loop 620 is approximately 200 kHz. The VGA 648 maintains the bandwidth of the outer AM correction loop 610 at a constant value to maintain high bandwidth in AM correction loop 610 while maintaining loop stability.

Even if the control input to the power amplifier 585 were to remain constant, changes that affect the output load of the power amplifier 585 would change the gain of the RF signal through the power amplifier 585, and thus change the gain between the control signal 568 and the detected signal 636. The correction bandwidth of outer AM correction loop 610 can be proportional to the gain of the feedback loop, including the gain through the power amplifier 585 and the VGA 648. Additionally, the stability of the outer AM correction loop 610 can be compromised if the loop gain is too high. Thus, it is important to keep the loop gain sufficiently high so as to correct any AM distortion, while keeping the loop gain low enough so as to ensure stability. Therefore the VGA 648 is used to correct gain variations in the power amplifier 585, maintaining a constant overall loop gain for the outer AM correction loop 610. Thus, using the inner AM correction loop 620 as a corrective feedback path allows stable control without restricting overall system bandwidth.

Due to the placement of the low pass filters 656 and 644 in the feedback paths instead of in the forward path, the forward bandwidth from the AM input signal on connection 546 to the power amplifier output on connection 556 is nearly independent of the response of both the inner and outer AM correction loops and is dependent only on the bandwidth of the power amplifier. In this manner, the feedback is corrective and not integrated, so changes to the forward path are made with a very low delay. The high bandwidth and low signal delay provided by the inner and outer AM correction loops provide accurate control of the power output of the power amplifier 585 using the VGA 648 and provide a highly linear control through the wide bandwidth outer AM correction loop 610.

The phase correction loop 630 includes the variable attenuator 608, a limiter 614, a phase detector 700, a switch 629, a low pass filter 624 and a phase shifter 627. The output signal of the variable attenuator on connection 612 is provided to a limiter 614. The limiter 614 removes the AM portion of the signal from the output on connection 612 and provides an input to the phase detector 700. The other input to the phase detector 700 is the PM signal on connection 584. The phase detector 700 determines a difference between the phase of the signal on connection 616 and the phase of the signal on connection 584 and provides an error signal on connection 622 representing the difference. The error signal is provided to the switch 629. In a first position, the switch 629 is set to provide the output of the phase detector 700 to the low pass filter 624, which provides an output to the phase shifter 627 on connection 626. The signal on connection 626 determines the extent to which the phase shifter 627 will shift the phase of the input signal on connection 584 and provide an appropriate PM input signal to the power amplifier 585 via connection 604.

In a second position, the switch 629 is configured to provide a reference voltage 631 as an input to the low pass filter 624. This effectively removes the phase correction loop 630 from the power amplifier circuit. The reference voltage 631 can be used to select whether the feedback is enabled. The phase correction loop 630 can be disabled by using switch 629 to provide a reference voltage 631 to the control input of the phase shifter 627 instead of the detected output from the phase detector 700. This allows the amplifier 585 to be used without phase correction from phase correction loop 630 such as when the switch 629 is set to provide the control to phase shifter 627 from the reference voltage 631. This can allow the phase correction loop 630 to be disabled when it is not required or when the output amplitude of the amplifier 585 is not large enough to be accurately detected.

The phase shifter 627 provides a phase shift range that exceeds 90 degrees and allows accurate and substantially linear control of the phases slope as a function of the error signal on connection 626.

The variable attenuator 608 provides coarse power control. By varying the attenuation of the feedback signal on connection 557, the variable attenuator 608 can control the output power of the power amplifier 585 through outer AM correction loop 510. The variable attenuator 608 also maximizes the range of the peak detector 628 range by keeping the operating point of the peak detector 628 relatively constant. The output power of the power amplifier 585 will settle to a level set by the outer AM correction loop 610. The baseband control signal on 532 determines the gain of the baseband VGA 634 and the closed loop control maintains the output of the baseband VGA 634 equal to the AM signal on connection 546. In an embodiment, the feedback signal to the AM correction loops and the phase correction loop is provided from separate variable attenuators.

The AM control signal provided to the power amplifier 585 via connection 568 may change the phase delay characteristics of the power amplifier 585 and induces a phase change. One mechanism which can cause this effect is that the change in output power induced by the change in the control signal 568 can cause the phase delay to change due to an AM/PM conversion mechanism in the power amplifier. The phase correction loop 630 provides a retarded or advanced phase of the signal on connection 584 to power amplifier 585 based on the error signal from the phase detector 618. The corrective characteristics of the phase detector 618 are encompassed by the bandwidth of the inner and outer AM correction loops. The phase correction loop 630 does not alter the phase of the signal on connection 584 if phase distortion is not present.

The VGA 648 maintains the bandwidth of the outer AM correction loop 610 at a constant value to prevent the outer AM correction loop 610 from introducing phase shift in the control loop and instability when the AM control signal is used to control the power amplifier 585. This maintains a low delay and a high bandwidth characteristic in that a constant delay equates to a constant bandwidth. The forward bandwidth from the AM input signal on connection 546 to the power amplifier output on connection 556 is independent of the response of both the inner and outer AM feedback loops and is dependent only on the bandwidth of the power amplifier control input. In this manner, the feedback is corrective and not integrated, so changes to the forward path are made with a very low delay. The high bandwidth and low delay provided by the inner and outer AM correction loops provide accurate control of the power output of the power amplifier 585 using the VGA 648 and provide a highly linear control through the wide bandwidth outer AM correction loop 610.

The power amplifier 585, phase correction loop 630, the outer AM correction loop 610 and the inner AM correction loop 620 can be fabricated on the same semiconductor die. In this manner, the response of the components will be closely matched with respect to temperature and process.

Figure 7:
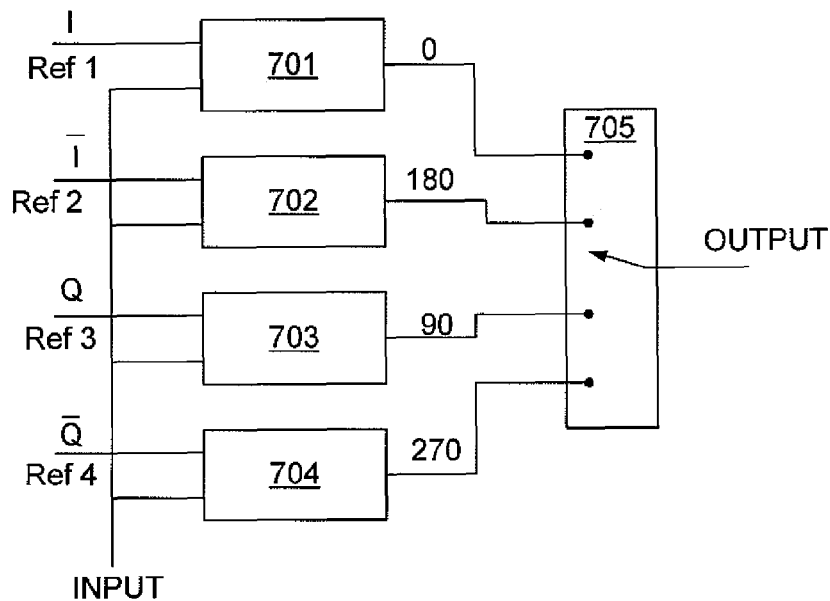
FIG. 7 is a schematic diagram of an embodiment of the phase detector of FIG. 6.

FIG. 7 is a schematic diagram of an embodiment of the phase detector 700 of FIG. 6. The phase detector 700 comprises phase detectors 701, 702, 703 and 704, and switch 705. The phase detector 701 receives an RF input signal as an RF input and a first RF reference signal as a reference input. The phase detector 702 receives the RF input signal as an input and a second RF reference signal as a reference input. The phase detector 703 receives the RF input signal as an input and a third RF reference signal as a reference input. The phase detector 704 receives the RF input signal as an input and a fourth RF reference signal as a reference input. The phase detectors 701, 702, 703 and 704 are configured so that their outputs can each be zero for a different phase of the RF input signal.

In an embodiment, the first, second, third and fourth RF reference signals can have different phases relative to one another. In this embodiment, the phase detectors 701, 702, 703 and 704 can be of similar construction to each other. In an embodiment, the reference phases can have quadrature relationship, such a I, $\bar{I}$, Q and $\bar{Q}$, or other suitable relationships. In an embodiment where the signals I, $\bar{I}$, Q and $\bar{Q}$ are provided to the phase detectors 701, 702, 703 and 704, respectively, the respective stable-point input phases of the phase detectors 701, 702, 703 and 704 can be 0, 180, 90 and 270 degrees.

The outputs of the phase detectors 701, 702, 703 and 704 are baseband signals that can indicate the phase offset between the input and reference signals. Stated another way, the phase detectors 701, 702, 703 and 704 can provide baseband signals having a phase offset. The term "offset" refers to the phase difference between the signals that are input (the input and reference signals) to the phase detectors.

The switch 705 can be used to select one of the outputs of the detectors 701, 702, 703 and 704 for connection to the output of the phase detector 700. Use of the switch 705 allows a system to select the most desirable output of the detectors 701, 702, 703 and 704 before enabling a phase correction loop, as described above. In an embodiment, the output of the detector having phase offset that is closest to the output phase of the power amplifier 585 (FIG. 6) should be selected by the switch 705 before the phase correction loop 630 (FIG. 6) is enabled by closing the switch 629 (FIG. 6). In an alternative embodiment, the switch 629 (FIG. 6) may be omitted and the function of the switch 629 (FIG. 6) can be simulated by causing the phase shifter 627 (FIG. 6) to ignore the control input signal on connection 626 (FIG. 6) when the phase correction loop is not closed. In an embodiment, the system can select the detector output to use in order to minimize a phase change associated with closing a feedback loop, such as the phase change 404 described above. Other numbers of detectors can be also used, such as increasing the number of detectors in order to further reduce the phase change.

Figure 8:
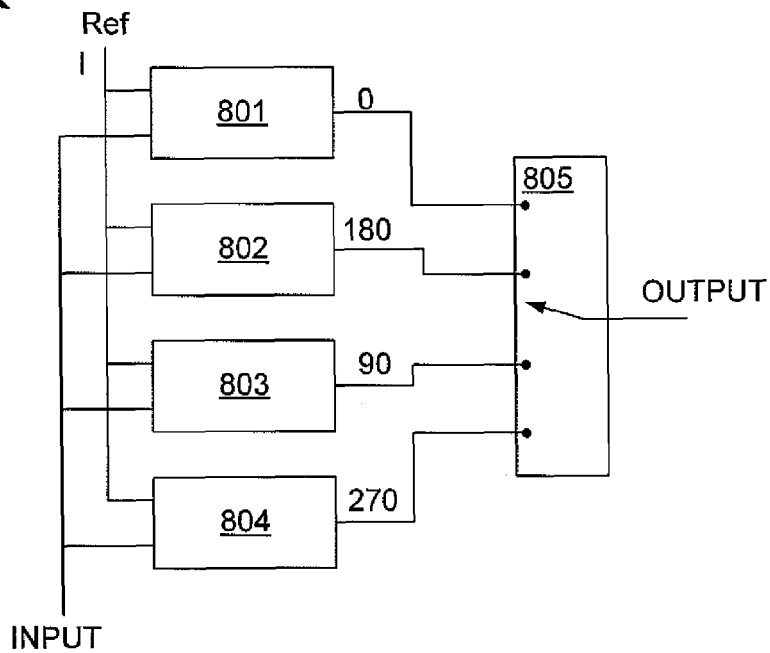
FIG. 8 is a schematic diagram illustrating an alternative embodiment of a phase detector.

FIG. 8 is a schematic diagram illustrating an alternative embodiment of a phase detector. The phase detector 800 comprises phase detectors 801, 802, 803 and 804, and switch 805. The phase detectors 801, 802, 803 and 804 receive the same RF input signal as an input and the same RF reference signal as a reference input. However, the phase detectors 801, 802, 803 and 804 each have different characteristics so that they produce different phase offsets. The phase detectors 801, 802, 803 and 804 are configured so that their outputs can each be zero for a different phase of the RF input, such as by using a different construction for each detector. The switch 805 can be used to select one of the outputs of detectors 801, 802, 803 and 804 for connection to the output of the phase detector 800. The phase detector 800 can allow the several detector outputs to be generated for selection while using only a single phase reference as input.

Figure 9:
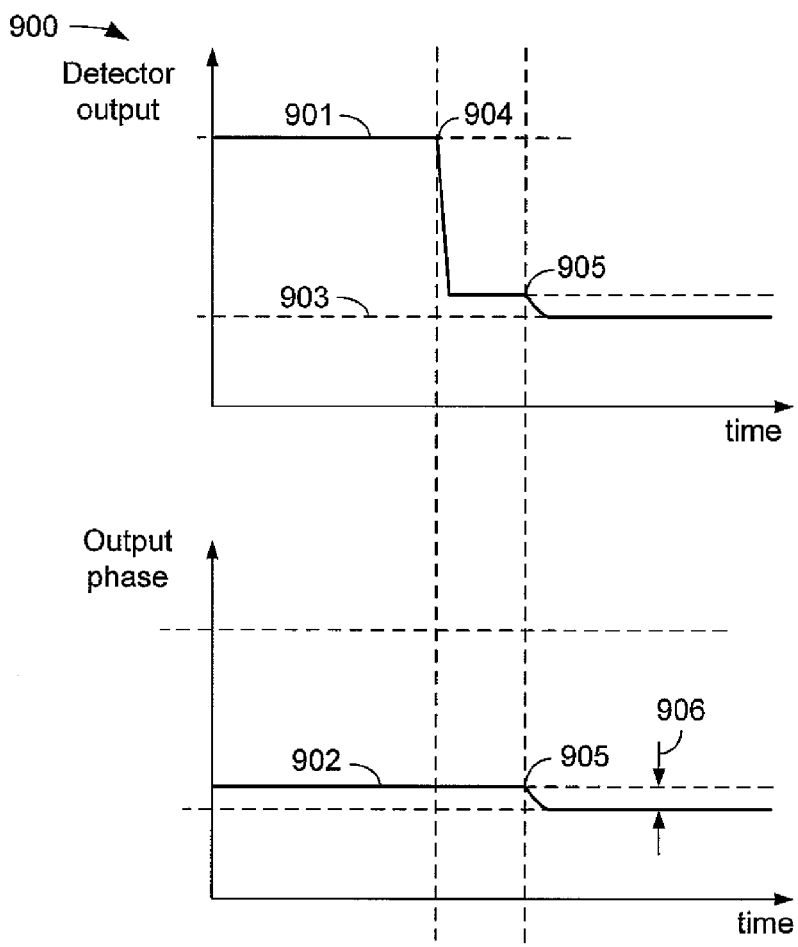
FIG. 9 is a graphical diagram illustrating exemplary operation of the phase correction feedback loop using a phase detector as described above.

FIG. 9 is a graphical diagram illustrating exemplary operation of the phase correction loop 630 using a phase detector as described above. The waveform 901 represents the output signal of the phase detector 700 versus time, and waveform 902 represents the output phase of the amplifier 585 versus time. At the beginning time of the plot, the switch 629 (FIG. 6) is set to provide the reference voltage to the control input of the phase shifter 627. At this time, the output of the phase detector 700 can have a large offset from the stable point of the system, such that if the phase correction loop 630 were closed, the phase shifter 627 (FIG. 6) would need to provide a large phase change. At time 904, the phase detector 700 is reconfigured, such as by setting a switch state of the switch 705 or the switch 805, for example, to provide an output which can be close to the stable point of the system. Then, at time 905, the phase correction loop 630 can be enabled by setting the switch 629 to provide the output of the phase detector 700 to the control input of the phase shifter 627. Since the output of the phase detector 700 can now be close to a stable point of the system, the phase change 906 following the enabling of the phase correction loop 630 may be reduced relative to the phase change 404 described above.

Figure 10:
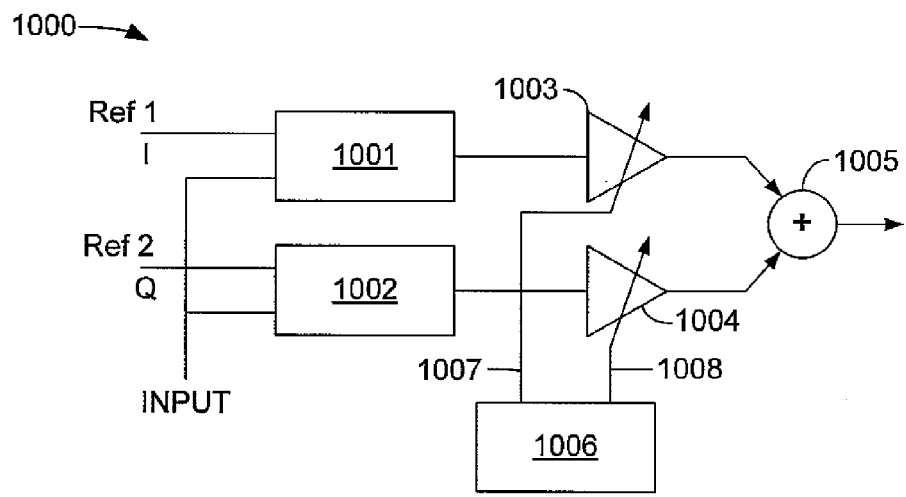
FIG. 10 is a schematic diagram illustrating an alternative embodiment of a phase detector.

FIG. 10 is a schematic diagram illustrating an alternative embodiment of a phase detector. The phase detector 1000 comprises phase detector 1001, phase detector 1002, a variable gain amplifier 1003, a variable gain amplifier 1004, a summing element 1005, and gain control circuitry 1006. The phase detector 1001 receives an RF input signal as an input and a first RF reference signal as a reference input. The phase detector 1002 receives the RF input signal as an input and a second RF reference signal as a reference input. In an embodiment, the first and second RF reference signals can have a relative phase difference of 90 degrees.

An output of the phase detector 1001 is provided to an input of the variable gain amplifier 1003, and an output of the phase detector 1002 is provided to an input of the variable gain amplifier 1004. The outputs of the variable gain amplifiers 1003 and 1004 are combined using the summing element 1005 to generate an output representing the detected phase. The summing element 1005 can be a summing amplifier, a summing of currents such as currents produced by variable gain amplifiers 1003 and 1004, or another suitable summing device.

The gain control circuitry 1006 provides gain control inputs 1007 and 1008 to the variable gain amplifiers 1003 and 1004 respectively so as to control the gains of the amplifiers 1003 and 1004. By adjusting the gains of the amplifiers 1003 and 1004, the phase detector 1000 can be configured to reduce a phase offset at its output, to reduce a phase change when a phase correction feedback loop is closed.

Figure 11:
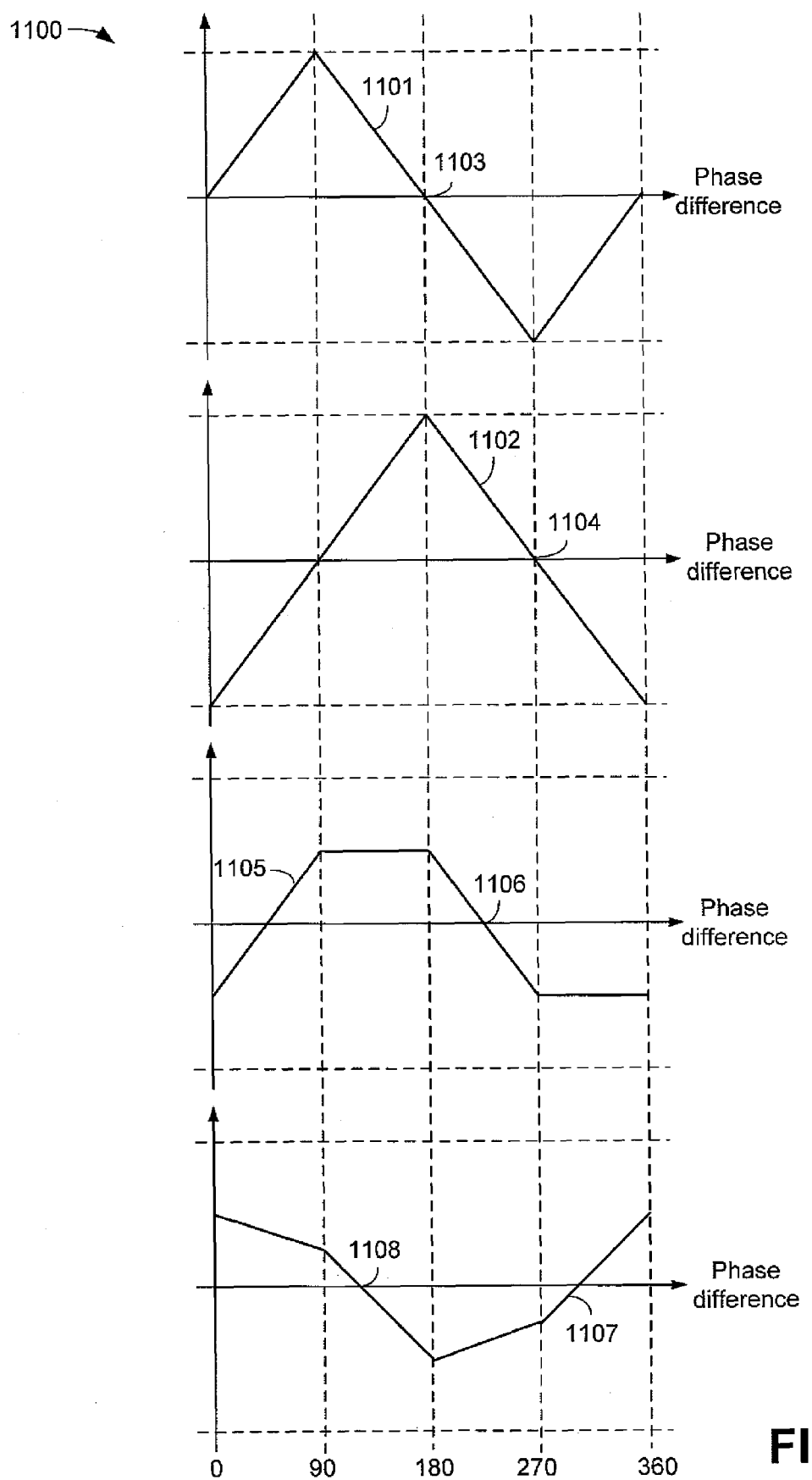
FIG. 11 is a graphical diagram illustrating exemplary operation of the phase detector of FIG. 10.

FIG. 11 is a graphical diagram illustrating exemplary operation of the phase detector 1000 of FIG. 10. The waveform 1101 depicts the output of the phase detector 1001, when the phase detector 1001 is implemented using a reference phase of 90 degrees. The waveform 1102 depicts the output of phase detector 1002, when the phase detector 1002 is implemented using a reference phase of 0 degrees. By setting the gain of the variable gain amplifier 1003 to a value of one and setting the gain of the variable gain amplifier 1004 to zero, the output of the phase detector 1001 can be used as the output of the phase detector 1000. When so configured, the waveform 1101 also represents the output of the phase detector 1000. When used in a phase correction loop with a stable point occurring when the output crosses zero with negative slope, use of the phase detector 1000 in this configuration can result in stable point 1103.

By setting the gain of the variable gain amplifier 1003 to a value of zero and setting the gain of variable gain amplifier 1004 to one, the output of the phase detector 1002 can be used as the output of phase detector 1000. When so configured, the waveform 1102 also represents the output of the phase detector 1000. When used in a phase correction loop with a stable point occurring when the output crosses zero with negative slope, use of the phase detector 1000 in this configuration can result in stable point 1104.

Other gain settings can be used to generate other stable points. For example, by setting the gain of the variable gain amplifier 1003 to a value of 0.5 and setting the gain of the variable gain amplifier 1004 to 0.5, the output of the phase detector 1000 is depicted by the waveform 1105. When used in a phase correction loop with a stable point occurring when the output crosses zero with negative slope, use of the phase detector 1000 in this configuration can result in stable point 1106. By setting the gain of the variable gain amplifier 1003 to a value of 0.33 and setting the gain of the variable gain amplifier 1004 to −0.67, the output of the phase detector 1000 is depicted by the waveform 1107. When used in a phase correction loop with a stable point occurring when the output crosses zero with negative slope, use of the phase detector 1000 in this configuration can result in stable point 1108. Other gain values can also be used.

In an embodiment, the gain control circuit 1006 can be configured to provide gain control signals GI and GQ to the variable gain amplifiers 1003 and 1004, respectively, such that abs(GI)+abs(GQ)=1. By appropriate selection of the values of GI and GQ under these constraints, any desired zero crossing point can be generated while keeping the slope of the output signal versus the input phase difference curve at this zero crossing constant. Using this circuit, the phase change caused by activating the phase correction loop 630 can be made as low as zero.

Figure 12:
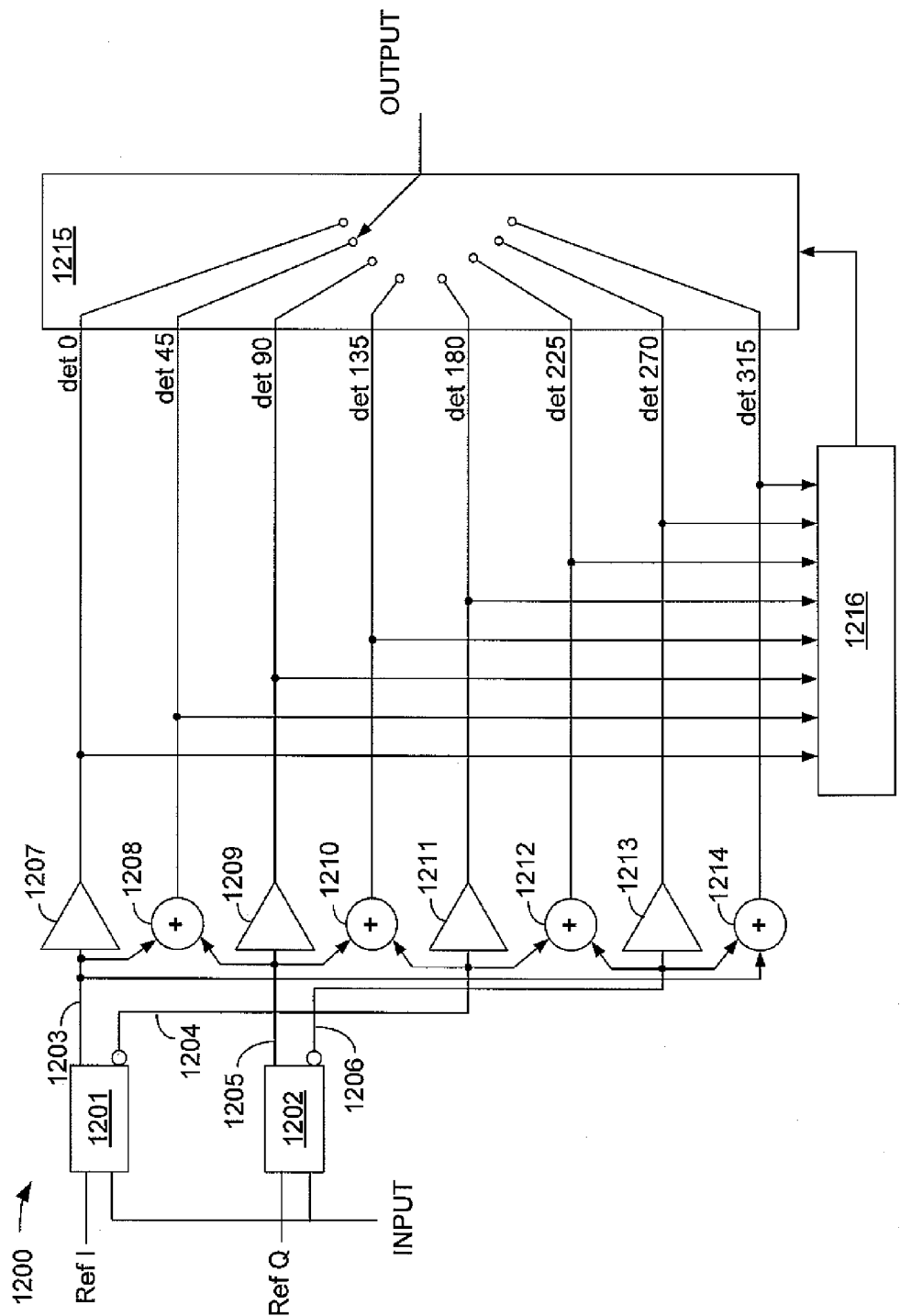
FIG. 12 is a schematic diagram illustrating an alternative embodiment of a phase detector.

FIG. 12 is a schematic diagram illustrating an alternative embodiment of a phase detector. The phase detector 1200 comprises a phase detector 1201, a phase detector 1202, gain elements 1207, 1209, 1211 and 1213, summing elements 1208, 1210, 1212 and 1214, switch 1215, and control circuit 1216. In an embodiment, the gain elements 1207, 1209, 1211 and 1213 are amplifying elements. The phase detector 1201 receives an RF input signal as an input and a first RF reference signal as a phase reference. The phase detector 1202 receives the RF input signal as an input and a second RF reference signal as a phase reference. The phase detector 1201 produces complementary outputs 1203 and 1204 representing the phase difference between the RF input and the first reference input. The phase detector 1202 produces complementary outputs 1205 and 1206 representing the phase difference between the RF input and the first reference input. In an embodiment, the first and second RF reference signals can have a relative phase difference of 90.

The gain element 1207 receives detected output 1203 and produces amplified signal det0. The summing element 1208 receives detected output 1203 and detected output 1205 to produce summed output det45. The gain element 1209 receives detected output 1205 and produces amplified signal det90. The summing element 1210 receives detected output 1205 and detected output 1204 to produce summed output det135. The gain element 1211 receives detected output 1204 and produces amplified signal det180. The summing element 1212 receives detected output 1204 and detected output 1206 to produce summed output det225. The gain element 1213 receives detected output 1206 and produces amplified signal det270. The summing element 1214 receives detected output 1206 and detected output 1203 to produce summed output det315. The switch 1215 can select output signals det0, det45, det90, det135, det180, det225, det270 and det315 for use as the output of phase detector 1200.

The control circuit 1216 can be used to set the switch 1215 to connect an output det0, det45, det90, det135, det180, det225, det270 or det315 to the output of the phase detector 1200. As each of the signals det0 through det315 can have different zero crossings in their output versus input RF phase response, implementation of a phase correction loop 630 with reduced phase change when the loop is enabled is possible. Alternately, the phase detector 1200 could be used in other systems where a reduced phase change is desired, or in other systems.

In an embodiment, the first and second RF reference signals have a quadrature relationship. For example, such that the first RF reference signal can be an in-phase signal, RefI, and the second RF reference signal can be a signal having a phase of 90 degrees, RefQ. In this embodiment, the output of the gain element 1207 can provide a stable point at a first input phase of phase detector 1200, the summing element 1208 can provide a stable point at an input phase 45 degrees from the first phase, the gain element 1209 can provide a stable point at an input phase 90 degrees from the first phase, and so on such that the summing element 1214 can provide a stable point at an input phase 315 degrees from the first phase. This can allow the phase correction loop 630 to have a maximum phase step of 22.5 degrees when the phase correction loop 630 is activated using appropriate selection of the setting of the switch 1215.

To reduce power consumption, the control circuit 1216 can be configured to disable one or more of the components, such as the phase detectors and summing elements, after a selection has been performed. In this manner, the components used to generate the non-selected output signals can be disabled. For example, if det225 is connected to the output of the phase detector 1200, the gain elements 1207, 1209, 1211 and 1213 along with the summing elements 1208, 1210 and 1214 may be disabled.

Figure 13:
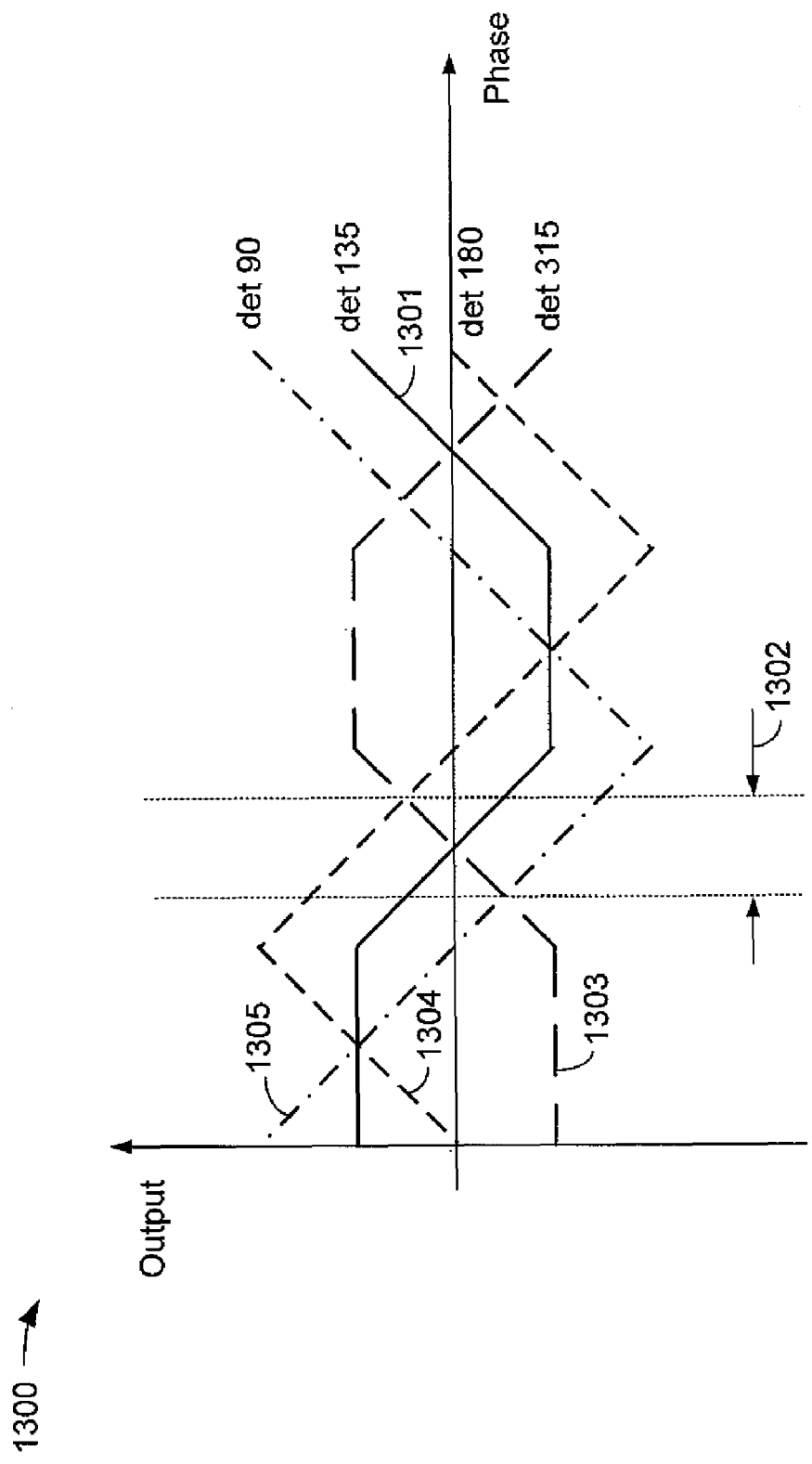
FIG. 13 is a graphical diagram illustrating exemplary operation of the phase detector of FIG. 12.

FIG. 13 is a graphical diagram illustrating exemplary operation of the phase detector 1200 of FIG. 12. The waveform 1301 depicts the output of the summing element 1210, det135. The waveform 1304 depicts the output of the gain element 1211, det180. The waveform 1305 depicts the output of the gain element 1209, det90. The waveform 1303 depicts the output of the summing element 1214, det315. If it is desired to use the phase detector 1200 in a region near a zero crossing with negative slope, the output of the summing element 1210, det135, can be used in the region 1302. At phase values other than those shown in the region 1302, another detector having an output closer to a desired zero crossing can be used. For example, at phase values just below region 1302, the output det90 of the gain element 1209 may be preferred because it has a zero crossing near those desired phase values. Additionally, at phase values just above region 1302, the output det180 of the gain element 1211 may be preferred because it has a zero crossing near those phase values.

In an embodiment, the control circuit 1216 can select the output det135 as the output of the phase detector 1200 by comparing adjacent phase outputs det90 and det180 with opposite phase output det315. The control circuit 1216 can select the output det135 if the opposite phase output det315 is greater than the lower adjacent phase output det90; and if the opposite phase output det315 is less than the upper adjacent phase output det180. This decision can result in the output det135 being used in region 1302. Other outputs can have similar selection criteria, using appropriate selections for the upper adjacent phase, lower adjacent phase, and opposite phase outputs. This selection may occur on one step, such as by using analog comparators and logic gates, or sequentially such as by using a state machine, or by other suitable methods.

Figure 14:
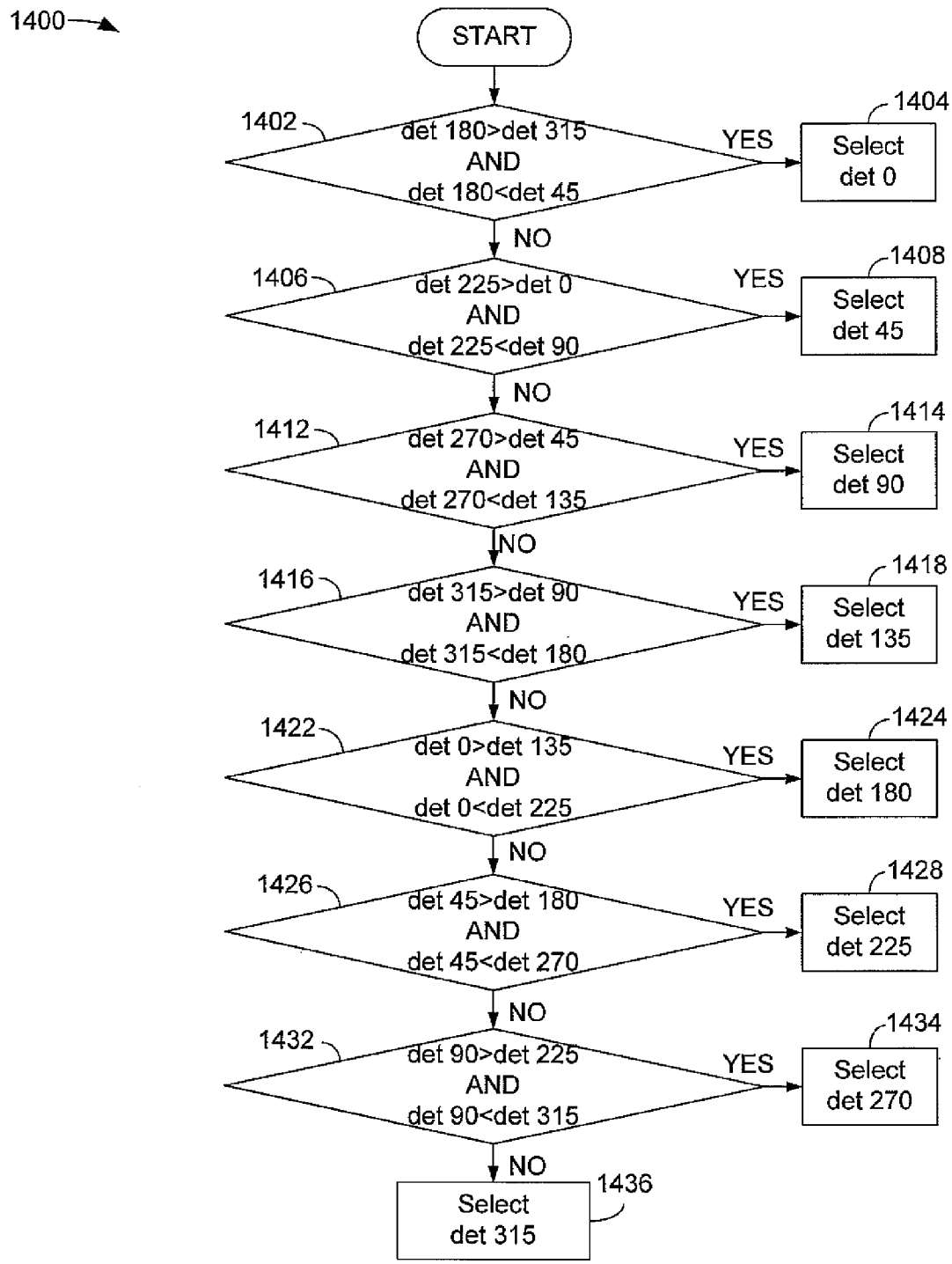
FIG. 14 is a flowchart illustrating a method for selecting an output of the phase detector of FIG. 12.

FIG. 14 is a flowchart illustrating a method for selecting an output of the phase detector 1200 of FIG. 12, and other suitable phase shifters. The method 1400 is an example of the operation of the control circuit 1216 in accordance with an embodiment of the present invention. The steps in the method 1400 can be performed in the order shown, out of the order shown, and can also be performed in parallel.

The outputs det0, det45, det90, det135, det180, det225, det270, and det315 are available as outputs of the phase detector 1200. The method 1400 may be performed to select one of the available outputs having a suitable zero crossing for an input phase near the phase of the RF signal present at the time the phase detector 1400 is enabled, to reduce the phase change caused by closing a phase correction loop, or other suitable purpose, as described above.

In block 1402, it is determined whether the signal det180 has value greater than the value of the signal det315; and whether the signal det180 has a value less than the value of the signal det45. This comparison, and the comparisons to be described below, can be performed by logic, which may comprise discrete circuit elements, an integrated circuit, or other logic elements within the control circuit 1216 (FIG. 12). In block 1402, the determination is made to decide whether the output det0 should be selected as the output of the phase detector 1200. When making this determination, the signal having a phase opposite the phase of the det0 signal is compared against an adjacent phase signal in both directions. In this case, the signal det180 (which has a phase opposite the phase of the signal det0 is compared against the phase of the signal det315 (the phase adjacent the phase det180 in a first direction) and the signal det180 is compared against the phase of the signal det45 (the phase adjacent the phase det180 in the opposite direction). If the signal det180 has value greater than the value of the signal det315, and the signal det180 has a value less than the value of the signal det45, then both conditions are met, and the signal det0 is selected in block 1404 to be used as an output of the phase detector 1200.

If either of the conditions in block 1402 is not met, then the process proceeds to block 1406 to determine whether the signal det225 has value greater than the signal det0 and whether the signal det225 has a value less than the value of the signal det90. This comparison is made to determine whether the signal det45 should be used as the output of the phase detector 1200. The comparison performed in block 1406 is similar to the comparison performed in block 1402, except that the signal having a phase opposite the phase of the signal det45 is used. In block 1406, the signal having a phase opposite the phase of the signal det45 is the signal det225.

The signal det225 is compared against the adjacent signals det0 and det90, as described above. Specifically, the signal det225 having a phase opposite the phase of the det45 signal is compared against an adjacent phase signal in both directions. In this case, the signal det225 (which has a phase opposite the phase of the signal det45) is compared against the phase det0 (the phase adjacent the phase det225 in a first direction) and is compared against the phase det90 (the phase adjacent the phase det225 in the opposite direction). If the signal det225 has value greater than the value of the signal det0 and if the signal det225 has a value less than the value of the signal det90, both conditions in block 1406 are met, and the signal det45 is selected in block 1408 as the output of the phase detector 1200.

If either of the conditions in block 1406 is not met, then the method 1400 proceeds to block 1412 to determine whether the signal det270 has value greater than the value of the signal det45 and whether the signal det270 has a value less than the value of the signal det135, as described above. If both conditions are met, the signal det90 is selected in block 1414 as the output of the phase detector 1200.

If either of the conditions in block 1412 is not met, then the method 1400 proceeds to block 1416, to determine whether the signal det315 has value greater than the value of the signal det90 and whether the value of the signal det315 has a value less than the value of the signal det180. If both conditions are met, the signal det135 is selected in block 1418 as an output of the phase detector 1200.

If either of the conditions in block 1416 is not met, then the method 1400 proceeds to block 1422 to determine whether the signal det0 has value greater than the signal det135 and to determine whether the signal det0 has a value less than the signal det225. If both conditions are met, the signal det180 is selected in block 1424 as an output of the phase detector 1200.

If either of the conditions in block 1422 is not met, then the method 1400 proceeds to block 1426 to determine whether the signal det45 has value greater than the value of the signal det180 and whether the signal det45 has a value less than the value of the signal det270. If both conditions are met, the signal det225 is selected in block 1428 as an output of the phase detector 1200.

If either of the conditions in block 1426 is not met, then the method 1400 proceeds to block 1432 to determine whether the signal det90 has value greater than the value of the signal det225 and whether the signal det90 has a value less than the values of the signal det315. If both conditions are met the signal det270 is selected in block 1434 as an output of the phase detector 1200.

If either of the conditions in block 1432 is not met, then the method 1400 proceeds to block 1436 where the signal det315 is selected as an output of the phase detector 1200.

Alternately, the method 1400 can be used to compare candidate signals det0, det45, det90, det135, det180, det225, det270 and det315 in order to select a configuration of a phase detector such as phase detector 1000 to output a signal related to the selected candidate value.

Figure 15:
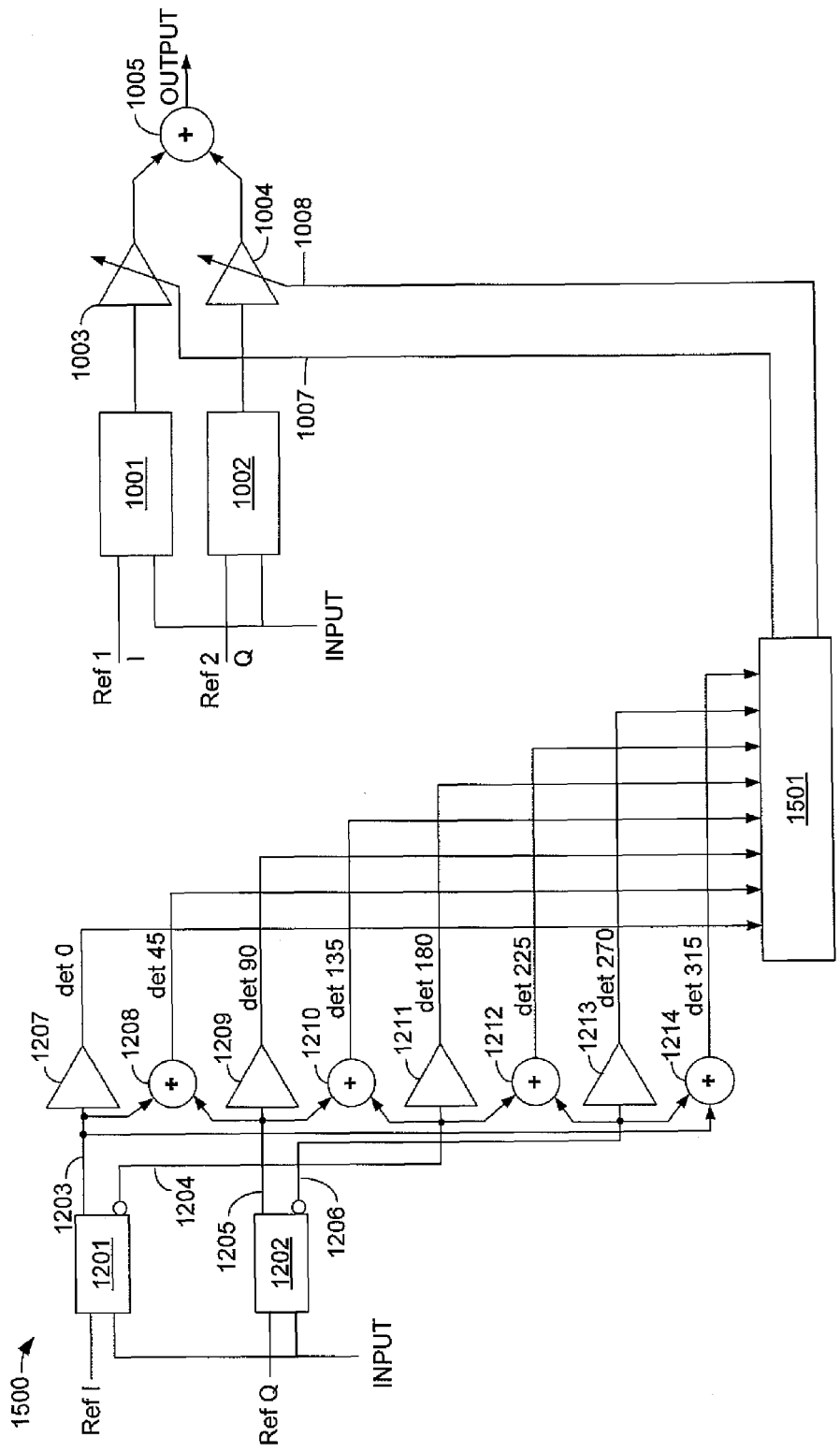
FIG. 15 is a schematic diagram illustrating an alternative embodiment of a phase detector.

FIG. 15 is a schematic diagram illustrating an alternative embodiment of a phase detector. The phase detector 1500 comprises phase detectors 1201 and 1202 (FIG. 12), 1001 and 1002 (FIG. 10), gain elements 1207, 1209, 1211 and 1213 (FIG. 12), summing elements 1208, 1210, 1212, 1214 (FIG. 12) and 1005 (FIG. 10), control circuit 1501, and variable gain amplifiers 1003 and 1004 (FIG. 10). The phase detector 1201 is provided with an RF input signal as an input and a first RF reference signal (RefI) as a reference. The phase detector 1202 is provided with the RF input signal as an input and a second RE reference signal (RefQ) as a reference. The phase detector 1001 is provided with the RE input signal as an input and the first RE reference signal (RefI) as a reference. The phase detector 1002 is provided with the RF input signal as an input and the second RF reference signal (RefQ) as a reference.

The detected outputs det0, det45, det90, det135, det180, det225, det270 and det315 are generated, as described above in FIG. 12, and are provided to the control circuit 1501. These detected outputs can be generated using the phase detectors 1201 and 1202, the gain elements 1207, 1209, 1211 and 1214, and the summing elements 1208, 1210, 1212 and 1214, as described above. The control circuit 1501 can select a desired output from among these detected outputs in a manner similar to the control circuit 1216, by using the method 1400, or in another suitable manner.

The phase detectors 1001 and 1002 can be used with the variable gain amplifiers 1003 and 1004 and the summing element 1005 to produce an output of the phase detector 1500 representing the detected phase of the RF input. The control circuit 1501 can generate gain control signals 1007 and 1008, to control the gain of the variable gain amplifiers 1003 and 1004 to produce a desired detection response. In an embodiment, the control circuit 1501 can control the gain of the variable gain amplifiers 1003 and 1004 to produce an output response that corresponds to the output selected from the available detected outputs det0, det45, det90, det135, det180, det225, det270 and det315. For example, if the control circuit 1501 has selected the signal det315 as the selected output of the phase detector 1500, the gain of the variable gain amplifier 1003 can be set to a gain of 0.5 and the gain of the variable gain amplifier 1004 can be set to a gain of −0.5. Other gain values can be used to generate responses that correspond to the other available detected outputs det0, det45, det90, det135, det180, det225 and det270.

The phase detector 1500 allows a phase detector similar to the phase detector 1000 (FIG. 10) to be used to generate an output while using a selection circuit similar to the selection circuit shown in the phase detector 1200. This can be beneficial in situations where low noise and low power consumption are important. The simple phase detection circuit comprising the phase detectors 1001 and 1002, the variable gain amplifiers 1003 and 1004 and the summing element 1005 can be optimized for low noise with low power consumption.

The circuit of the phase detector 1200 can be difficult to optimize for noise with low power consumption, since each path is preferably independently low noise. This can result in a potential increase in the current consumption by a factor of eight to maintain the same noise had a single path been implemented. By using the circuitry of FIG. 12 only to select the proper settings for the phase detector shown in FIG. 10, only the components 1001, 1002, 1003, 1004 and 1005 need to be optimized for noise, while the components in FIG. 12 can be small and consume little current, allowing a simple control method, such as method 1400, to be used to control a low noise phase shifter using components 1001, 1002, 1003, 1004 and 1005.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A phase detector, comprising:
a plurality of phase detectors located in a phase correction loop, each phase detector configured to receive as input a radio frequency (RF) input signal and an RF reference signal, each of the plurality of phase detectors also configured to provide a signal representing a different phase offset based on the phase difference between the RF input signal and the RF reference signal; and
a switch configured to receive an output of each of the plurality of phase detectors and configured to select the output representing the phase offset that is closest to a phase of an output of an amplifier.

2. The phase detector of claim 1, in which each of the plurality of phase detectors receives a different reference signal to generate each respective phase offset.

3. The phase detector of claim 2, in which each of the plurality of phase detectors receives a different quadrature reference signal.

4. The phase detector of claim 1, in which each of the plurality of phase detectors receives the same reference signal and has a different characteristic to generate each respective phase offset.

5. The phase detector of claim 1, further comprising a gain element associated with each of the plurality of phase detectors, the gain element configured to select an output for the phase detector based on a control signal.

6. The phase detector of claim 1, in which each of the plurality of phase detectors is configured to provide an output signal and a complement of the output signal and the output signal and the complement of the output signal are provided to:
a plurality of gain elements and a plurality of summing elements, the plurality of gain elements and the plurality of summing elements configured to provide output signals representing signals that are separated in phase by approximately 45 degrees.

7. The phase detector of claim 5, further comprising a control circuit configured to receive the output signals representing signals that are separated in phase by approximately 45 degrees and configured to select one of the output signals representing signals that are separated in phase by approximately 45 degrees that is closest in phase to the phase of a signal output from the amplifier.

8. The phase detector of claim 6, further comprising a selection circuit configured to select one of the output signals representing signals that are separated in phase by approximately 45 degrees that is closest in phase to the phase of a signal output from the amplifier as an output of the phase detector.

9. The phase detector of claim 7, in which the selection circuit further comprises:
a second plurality of phase detectors configured to receive as input the RF input signal and the RF reference signal; and
a gain element associated with each of the second plurality of phase detectors, the gain element configured to select an output for the phase detector based on a control signal provided by the control circuit.

10. A method for selecting a phase detector output, comprising:
generating a plurality of signals representing signals that are separated in phase by a predetermined amount;
selecting one of the signals;
comparing a signal having a phase opposite in phase than the selected signal with two adjacent signals, one of the two adjacent signals indicating a phase that is adjacent the selected signal in a first direction and the other of the two adjacent signals indicating a phase that is adjacent the selected signal in a second direction; and
choosing the selected signal as an output of the phase detector if a value of the signal indicating a phase opposite in phase than the selected signal lies between the values of the two adjacent signals.

11. The method of claim 10, in which each of a plurality of phase detectors receives a different reference signal to generate a respective phase offset.

12. The method of claim 10, in which each of a plurality of phase detectors receives the same reference signal and has a different characteristic to generate a respective phase offset.

13. The method of claim 10, further comprising choosing the selected signal as an output of the phase detector when the selected signal represents a phase that is closest to the phase of a signal output from the amplifier.

14. A portable transceiver having a phase detector, comprising:
a transmitter coupled to a receiver;
a power amplifier associated with the transmitter, the power amplifier having a linear control characteristic, the power amplifier configured to amplify a phase-modulated (PM) signal according to the amplitude of an amplitude-modulated (AM) signal;
a feedback signal taken from the power amplifier;
a limiter configured to receive the feedback signal;

a phase detector comprising:
- a plurality of phase detectors located in a phase correction loop, each phase detector configured to receive as input a radio frequency (RF) input signal and an RF reference signal, each of the plurality of phase detectors also configured to provide a signal representing a different phase offset based on the phase difference between the RF input signal and the RF reference signal; and
- a switch configured to receive an output of each of the plurality of phase detectors and configured to select the output representing the phase offset that is closest to a phase of an output of an amplifier.

15. The portable transceiver of claim 14, in which each of the plurality of phase detectors receives a different reference signal to generate each respective phase offset.

16. The portable transceiver of claim 15, in which each of the plurality of phase detectors receives a different quadrature reference signal.

17. The portable transceiver of claim 14, in which each of the plurality of phase detectors receives the same reference signal and has a different characteristic to generate each respective phase offset.

18. The portable transceiver of claim 14, further comprising a gain element associated with each of the plurality of phase detectors, the gain element configured to select an output for the phase detector based on a control signal.

19. The portable transceiver of claim 14, in which each of the plurality of phase detectors is configured to provide an output signal and a complement of the output signal and the output signal and the complement of the output signal are provided to:
- a plurality of gain elements and a plurality of summing elements, the plurality of gain elements and the plurality of summing elements configured to provide output signals representing signals that are separated in phase by approximately 45 degrees.

20. The portable transceiver of claim 19, further comprising a control circuit configured to receive the output signals representing signals that are separated in phase by approximately 45 degrees and configured to select one of the output signals representing signals that are separated in phase by approximately 45 degrees that is closest in phase to the phase of a signal output from the amplifier.

21. The portable transceiver of claim 20, further comprising a selection circuit configured to select one of the output signals representing signals that are separated in phase by approximately 45 degrees that is closest in phase to the phase of a signal output from the amplifier as an output of the phase detector.

22. The portable transceiver of claim 21, in which the selection circuit further comprises:
- a second plurality of phase detectors configured to receive as input the RF input signal and the RF reference signal; and
- a gain element associated with each of the second plurality of phase detectors, the gain element configured to select an output for the phase detector based on a control signal provided by the control circuit.

* * * * *